United States Patent [19]
Tokiai et al.

[11] Patent Number: 4,992,235
[45] Date of Patent: Feb. 12, 1991

[54] METHOD FOR PRODUCING THERMOELECTRIC ELEMENTS

[75] Inventors: Takeo Tokiai; Takashi Uesugi, both of Sodegaura, Japan

[73] Assignee: Idemitsu Petrochemical Co., Ltd., Tokyo, Japan

[21] Appl. No.: 327,592

[22] Filed: Mar. 23, 1989

[30] Foreign Application Priority Data

| Mar. 30, 1988 | [JP] | Japan | 63-78454 |
| Jul. 15, 1988 | [JP] | Japan | 63-177795 |
| Jul. 15, 1988 | [JP] | Japan | 63-177796 |

[51] Int. Cl.$^5$ ............................................. B22F 1/00
[52] U.S. Cl. ...................................... 419/23; 419/31; 419/38; 419/57; 75/10.19
[58] Field of Search ................. 419/23, 31, 38, 57; 75/10.19

[56] References Cited

U.S. PATENT DOCUMENTS

| 4,500,742 | 2/1985 | Morimoto et al. | 136/206 |
| 4,589,918 | 5/1986 | Nishida et al. | 75/244 |
| 4,759,905 | 7/1988 | Walter et al. | 419/23 |
| 4,764,212 | 8/1988 | Okumura | 75/228 |

Primary Examiner—Stephen J. Lechert, Jr.
Assistant Examiner—Leon Nigohosian, Jr,
Attorney, Agent, or Firm—Antonelli, Terry, Stout & Kraus

[57] ABSTRACT

Thermoelectric elements with excellent thermoelectric characteristics such as Seebeck coefficient thermoelectromotive force and thermal conductivity can be produced by molding a powder of metal or metal alloy as the raw material and then sintering; by using as such raw material, ultra fine powders containing Fe and Si as main components and having a mean particle diameter of 50 to 5,000 Å.

9 Claims, 6 Drawing Sheets

METHOD FOR PRODUCING THERMOELECTRIC ELEMENTS

BACKGROUND OF THE INVENTION

1. Field of the Invention

The present invention relates to a method for producing thermoelectric elements and more particularly to a method for efficiently producing thermoelectric elements having excellent thermoelectric characteristics by controlling the particle diameter of the metal and metal alloy as the raw material.

2. Description of the Related Arts

In recent years, thermoelectric elements to be used in thermoelectric generation utilizing the Seebeck effect have been expected to be put into practice in various fields, and for production of, such thermoelectric elements, various methods have been proposed. A typical method is such that mechanically ground metal and metal alloy are used as the raw material, and they are molded by compressing by the use of, e.g., a press, sintered and then subjected to thermal treatment to produce a thermoelectric element having a predetermined shape.

The thermoelectromotive force of a thermoelectric element obtained by the above conventional method is not always sufficiently high and, therefore, it has been desired to develop a thermoelectric element having a high thermoelectromotive force.

Moreover, since the above mechanically ground metal and metal alloys have a large particle diameter and are not uniform in shape, the above conventional method has problems in that the sintering temperature is high, the sintering density after molding is not increased, and intergranular controlling is difficult.

SUMMARY OF THE INVENTION

An object of the present invention is to provide a method for producing a thermoelectric element which is excellent in thermoelectric characteristics such as thermoelectromotive force and thermal conductivity.

The present invention relates to a method for producing a thermoelectric element by molding metal or metal alloy powders as the raw material and then sintering the resulting molding, which method is characterized in that as the raw material, ultra fine powders containing Fe and Si as main components and having a mean particle diameter of 50 to 5,000 Å are used.

DESCRIPTION OF PREFERRED EMBODIMENTS

The raw material of the thermoelectric element to be used in the present invention contains Fe and Si as main components. For example, silicides such as $Fe_{1-x}Mn_xSi_2$ (x=0 to 0.15) or $Fe_{1-y}Co_ySi_2$ (y=0 to 0.10) can be used. Typical examples are $FeSi_2$, $Fe_{0.92}Mn_{0.08}Si_{2.00}$ and $Fe_{0.95}Co_{0.05}Si_{2.00}$.

In the present invention, as the metal or metal alloy to be used as the raw material, ultra fine particle-formed powder having a mean particle diameter of 50 to 5,000 Å, preferably 100 to 3,000 Å, and more preferably 100 to 1,000 Å (hereinafter referred to merely as ultra fine particles), is used.

In production of ultra fine particles of metal or metal alloys, commonly used methods such as the plasma method, the CVD method, the evaporation method or the ball mill method can be employed. In particular, the plasma method is preferred.

For the plasma method, high frequency plasma method, arc plasma jet method, hybrid plasma method and so forth can be used. In accordance with these methods, simultaneously with the synthesis of various metal alloys, ultra fine particles can be easily obtained.

Figure 1:
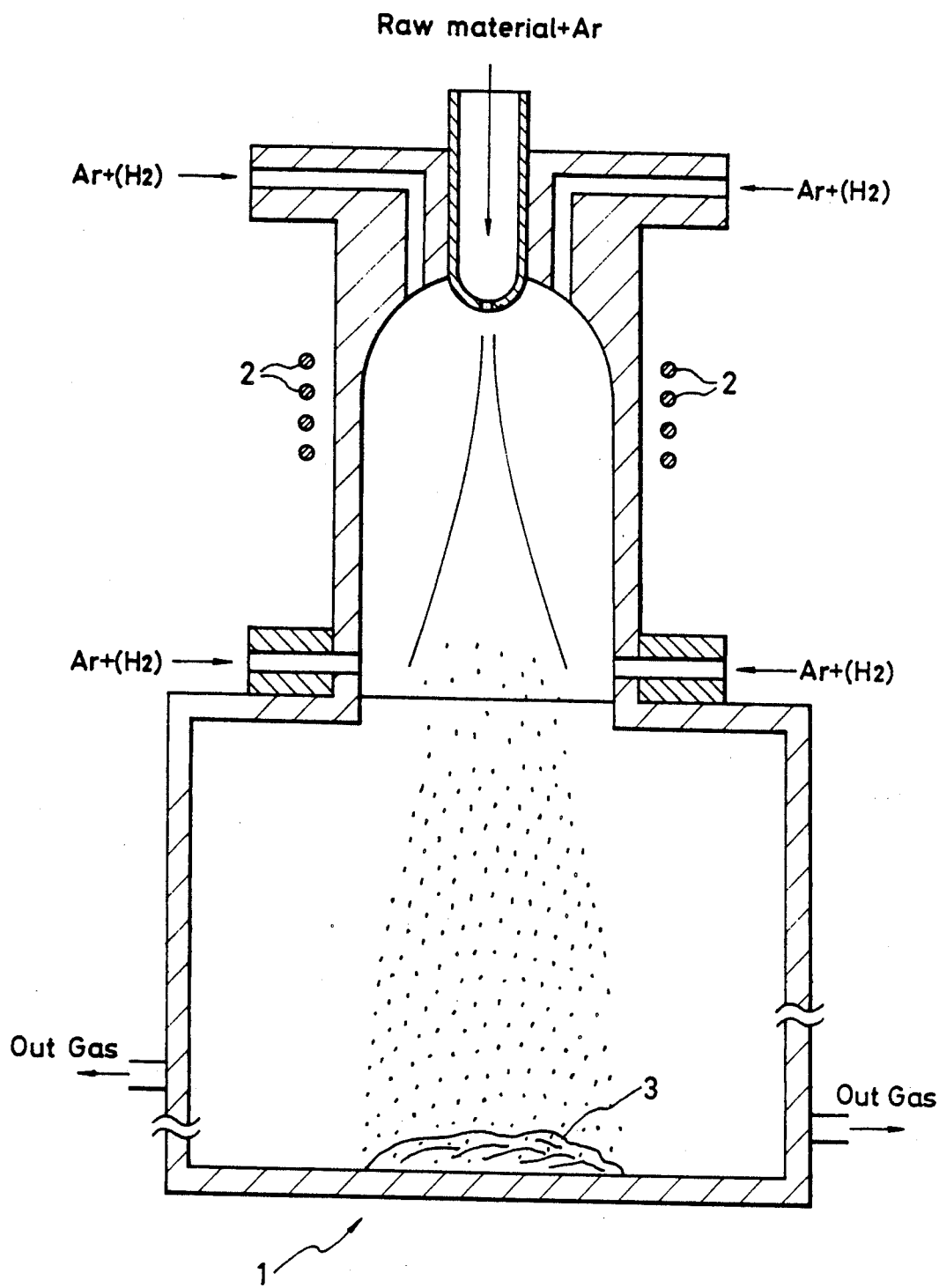
FIG. 1 is a cross sectional view showing an embodiment of a high frequency plasma furnace.

FIG. 1 shows an example of a high frequency (RF) plasma furnace for producing ultra fine particles by the above plasma method. A powder having the aforementioned composition is used as the raw material and introduced along with argon (Ar) gas in a RF plasma furnace 1 where the raw material powder is gasified by generating high temperature plasma of 10,000 K in temperature by the use of a high frequency coil 2. In the lower part, the gasified raw material powder is solidified by quenching with Ar gas to produce ultra fine particles 3. Concrete conditions for the plasma treatment are as follows:

| | |
|---|---|
| RF power | 10 to 50 (kw) |
| Ar flow rate | 10 to 50 (liters/min) |
| $H_2$ flow rate | 1 to 10 (liters/min) |
| Amount of raw material supplied | 1 to 100 (g/min) |

The above Ar flow rate is an amount of containing Ar supplied along with the raw material, and Ar supplied from other two points. $H_2$ is supplied to the RF plasma furnace 1 and acts to control the temperature of argon plasma and to stabilize the plasma.

By producing ultra fine particles by subjecting the raw material to the plasma treatment, ultra fine particles having a mean particle diameter of 50 to 5,000 Å can be easily produced, and the particle diameter can be much smaller as compared with the conventional thermoelectric elements in which the particle diameter is about 1 μm. By application of the plasma treatment for powdering of the raw material, the phase of ultra fine particle can be made a semiconductor phase alone or a mixed phase of a semiconductor phase and a metal phase. In the mixed phase, the ratio of the semiconductor phase ($\beta$) to the metal phase ($\alpha+\epsilon$) is preferably from 9:1 to 1:1, and more preferably from 6:1 to 2:1. By making fine particles of sintered material constituting the thermoelectric element, smaller than the conventional ones, and further by producing fine particles of a semiconductor phase or ultra fine particles of a mixed phase of a semiconductor phase and a metal phase, there can be obtained a thermoelectric element having such high characteristics in that the thermoelectromotive force and specific resistance are increased, and thermal conductivity is decreased. In producing fine particles by application of the plasma treatment, the sintering and heat treatment steps can be simplified as compared with step of the conventional grind using a ball mill. Moreover, since ultra fine particles are used as the raw material for the thermoelectric element, sintering can be carried out at a lower temperature and the energy cost can be reduced.

By changing the type of the raw material or conditions for the plasma treatment, particularly the RF power in the above plasma treatment, the particle diameter of ultra fine particles to be produced can be controlled and the phase of the ultra fine particle can be made not only a semiconductor phase but also a mixed phase of a semiconductor phase and a metal phase. If only a powder having a large particle diameter as obtained by the usual mechanical powdering is used, the resulting thermoelectric element has an insufficiently low thermoelectromotive force, and the objects of the present invention cannot be attained.

In the method of the present invention, characteristics of the thermoelectric element can be improved by subjecting the above ultra fine particles of metal and metal alloy as the raw material for the thermoelectric element in an atmosphere of reducing gas or reducing gas and halogen or halogen compound-containing gas at the time of sintering or at an appropriate time before the sintering, more specifically (1) in the state of ultra fine particles before molding, (2) at the time of molding, or (3) at the time of sintering.

During the heat treatment in the above reducing gas atmosphere, the amount of oxygen contained in the raw material is controlled to adjust the amount of oxygen as a dopant to a suitable one, thereby increasing thermoelectric characteristics. As the reducing gas, various gases can be used. Of these gases, $H_2$, CO, $SiH_4$, $SiH_6$, $GeH_4$ and the like are preferably used. This reducing gas is introduced into the heat treatment step along with a carrier gas comprising generally used inert gases such as argon (Ar). The reducing gas is used alone or as a mixture. In a case where the carrier gas is Ar, the mixing ratio of reducing gas and carrier gas is as follows: $H_2/Ar = 2$ to 15%, $CO/Ar = 2$ to 10%, $(H_2+SiH_4)/Ar = 5$ to $10+5$ to 10 (%), $(H_2+SiH_6)/Ar = 2$ to $6+5$ to 10 (%), $(H_2+GeH_4)/Ar = 5$ to $15+5$ to 10 (%).

The heat treatment of ultra fine particles is carried out at a temperature of 400° to 1,150° C. under a pressure of 0 to 10 kg/cm²G for 7 to 60 hours while feeding the above reducing gas, for example, at a rate of 5 to 100 ml/min per gram of the raw material in the case of $H_2$. Conditions are determined appropriately, depending on the type, the particle diameter and the oxygen content of the raw material and so forth.

In the heat treatment of ultra fine particles of the raw material in a mixed gas atmosphere obtained by adding halogen, e.g. $F_2$, $I_2$ or $Br_2$, or a halogen compound, e.g. HF or $CF_4$ to the above reducing gas, the oxygen content of the raw material is controlled, as in the above case, and at the same time thermoelectric characteristics can be improved by introducing halogen into the raw material. Various halogens or halogen compounds can be used. The amount of halogen or halogen compound is determined appropriately in depending on the type of the raw material and so forth as in the case of the reducing gas. For example, when the halogen compound gas is HF, the mixing amount is suitably such that $(HF+H_2)/Ar = 1$ to $5+5$ to 10 (%).

The action of the heat treatment in an atmosphere of the above reducing gas or a mixed gas of the reducing gas and halogen or halogen compound gas will hereinafter be explained.

Super fine particles as the raw material of the thermoelectric element usually contain oxygen in a large amount as high as 2.0 to 15 wt %. The state in which oxygen is contained can be classified into four types: (1) surface adsorption; (2) surface oxide film; (3) inter-lattice substitution; and (4) inter-lattice invasion. Of these types, oxygen in the lattice acts as a dopant in the thermoelectric characteristics. However, in some cases, oxygen on the surface in types (1) and (2) combines with Fe or Si of the raw material at the subsequent step, e.g. the sintering step, precipitating as a mono-phase oxide, and does not act as a dopant. For this reason, the unnecessary oxygen is removed or reacted with Fe or Si of the raw material by application of the heat treatment using the above reducing gas so as to produce Fe-O, Si-O, etc. in the effective form as a dopant, thereby improving thermoelectric characteristics. Moreover, by adding halogen or a halogen compound to the reducing gas having the aforementioned action, the halogen, e.g. fluorine is caught in the raw material and enters the inside of the lattice, or replaces Si in the lattice and effectively acts as a dopant, thereby improving thermoelectric characteristics.

By changing the oxygen contained in the raw material into a form effective as a dopant and at the same time, removing excessive oxygen, and further introducing halogen acting as a dopant into the raw material, the anion dopant amount of the raw material can be controlled, thereby improving thermoelectric characteristics.

In the method of the present invention, a thermoelectric element can be produced by mixing a powder of metal or metal alloy (hereinafter referred to merely as powder) having a mean particle diameter of 1 to 5 μm, preferably 2 to 3 μm with the above ultra fine particles. As this powder, the same metal or metal alloy as that of the above ultra fine particle is powdered and used. In powdering the metal or metal alloy, mechanical powdering methods conventionally in general use, such as the atomizing method, the liquid quenching method, the jet mill method, the ball mill method, or the stamp mill method can be employed.

Ultra fine particles and powder of the metal or metal alloy to be used as the raw material of the thermoelectric element are molded after mixing.

The mixing ratio of ultra fine particles to powder is not critical. In general, they are compounded in a range such that the powder is 97 to 50 wt % and the ultra fine particles are 3 to 50 wt %, and preferably the powder is 95 to 60 wt % and the ultra fine particles are 5 to 40 wt %.

The mixing ratio is determined appropriately within the suitable range depending on the type of raw material, the particle diameter of each component, the molding pressure, the shape of the molding and so forth.

Although the ultra fine particles and the powder can be mixed by various methods, it is difficult to sufficiently mix them by mechanical stirring and, therefore, it is preferred that they be thoroughly mixed by the use of a dispersing agent, a binder, or ultrasonic waves. For example, the ultra fine particles and the powder can be sufficiently uniformly mixed by pre-mixing them with a stirring apparatus, e.g. a ball mill, dispersing the resulting mixture in solution of e.g. polyvinyl alcohol, an ethyl vinyl acetate copolymer, stearic acid, colloidal paraffin (oils and fats), or paraformaldehyde to form a gel or sol, and then evaporating solvent from the gel or sol by heating while applying ultrasonic waves to form into a granular form.

By mixing the ultra fine particles and the powder, the slight clearance between particles of the powder is filled with the ultra fine particles at the time of molding and thus particle boundary or particle growth can be controlled. As a result, the sintering density is increased and at the same time, the clearance is decreased and, therefore, there can be obtained a sintered material which is dense and in which the particle boundary is controlled, and in particular the thermal conductivity is decreased, and the thermoelectric characteristics of the thermoelectric element obtained can be increased.

In the method of the present invention, the above prepared powder is molded, sintered and further is subjected to heat treatment, if necessary, according to the usual method.

That is, the molding step, the sintering step or the subsequent heat treatment step can be carried out in the same manner as in the conventional method for producing thermoelectric elements.

For example, molding can be carried out by compressing under a pressure of several hundred kilograms to several tons per square centimeter by the use of a compression molding machine. Sintering can be carried out by heating the molded material at a high temperature of 800° to 1,200° C. for several hours. In addition, heat treatment is carried out, if necessary, by heating the molded material after sintering at a temperature of 700° to 900° C. for several hours. These treatments are carried out under suitable conditions determined depending on the type and form of metal or metal alloy as the raw material and so forth, and are not critical in such conditions.

The present invention is described in greater detail with reference to the following examples.

EXAMPLE 1

Iron silicide $FeSi_2$ of metal phase (Fe:Si:(Co or Mn)=(0.85 to 0.995):2.05:(0.005 to 0.15)) was used as the powder. This powder was supplied to an RF plasma furnace and was subjected to plasma treatment under the conditions as shown below to produce ultra fine particles. In these ultra fine particles, the particle diameter was within the range of 50 to 5,000 Å, and the ratio of metal phase ($\alpha,\epsilon$) to semiconductor phase ($\beta$) was (0 to 1):(0.3 to 10.0).

| | |
|---|---|
| RF power | 10 to 100 (kW) |
| Ar flow rate | 10 to 100 (liters/min) |
| H₂ flow rate | 1 to 10 (liters/min) |
| Amount of feed supplied | 1 to 100 (g/min) |

In this example, the concrete treating conditions were set as follows: RF power=35 (kW); Ar flow rate=30 (liters/min); H₂ flow rate=2 (liters/min); and amount of feed supplied=5 (g/min).

The $FeSi_2$ eutectic alloy ultra fine particles thus obtained ($\alpha+\epsilon:\beta=1:3$, mean particle diameter: 250 to 700 Å) were subjected to compression molding, sintering (in vaccum, 850° to 1,150° C., 1 to 5 hours) and heat treatment (800° to 850° C., 10 to 24 hours) to produce N type and P type thermoelectric elements.

Figure 2:
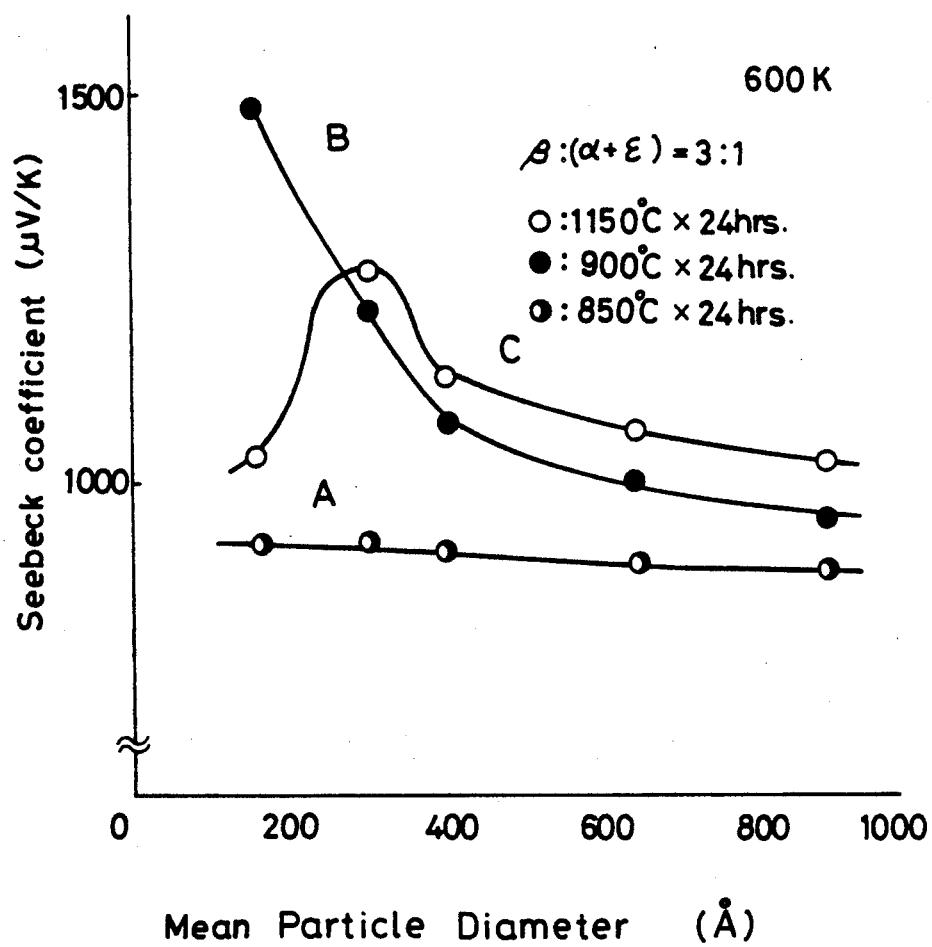
FIG. 2 is a graph showing the relation between particle diameter and Seebeck coefficient in the thermoelectric element of Example 1.

In connection with a thermoelectric element produced using ultra fine particles in which the ratio of mixed phase, ($\alpha+\beta:\epsilon=1:3$) was 3.0 (which was produced by changing the plasma treatment conditions), a Seebeck coefficient vs. mean particle diameter (calculated with T.E.M. Method) at a temperature of 600 K. was measured, and the results are shown in FIG. 2. A Seebeck coefficient of a thermoelectric element produced at varied sintering temperatures was measured, and the results are also shown in FIG. 2. In FIG. 2, Curve A indicates a relation between particle diameter and Seebeck coefficient when sintering was carried out at 850° C. for 24 hours; Curve B indicates a relation between particle diameter and Seebeck coefficient when sintering was carried out at 900° C. for 24 hours; and Curve C indicates a relation between particle diameter and Seebeck coefficient when sintering was carried out at 1,150° C. for 24 hours. All sintered materials were subjected to heat treatment in vacuum at 800° C. for 200 hours.

Figure 3:
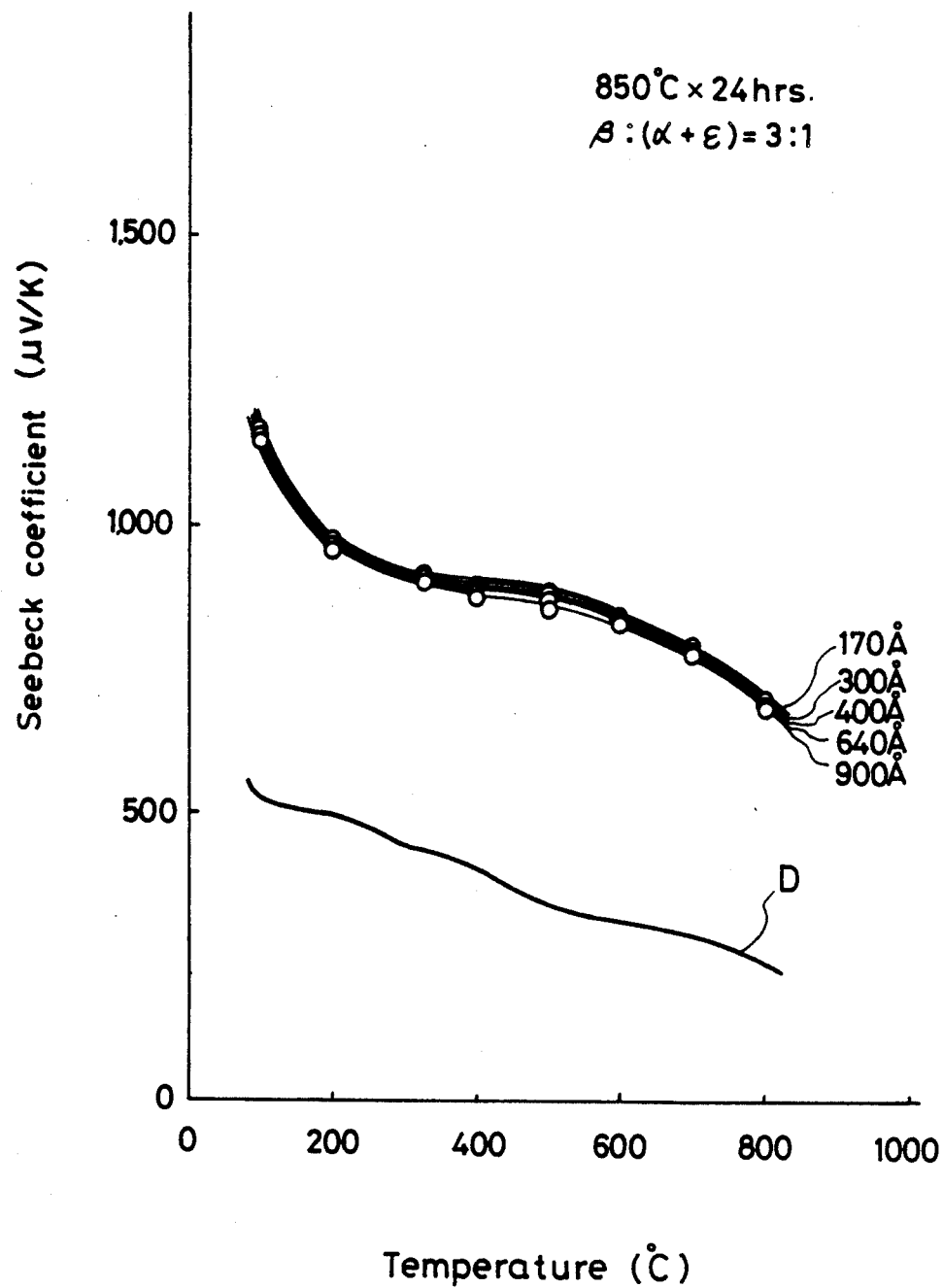
FIG. 3 is a graph showing the relation between temperature and Seebeck coefficient in the thermoelectric element sintered at 850° C. in Example 1.
Figure 4:
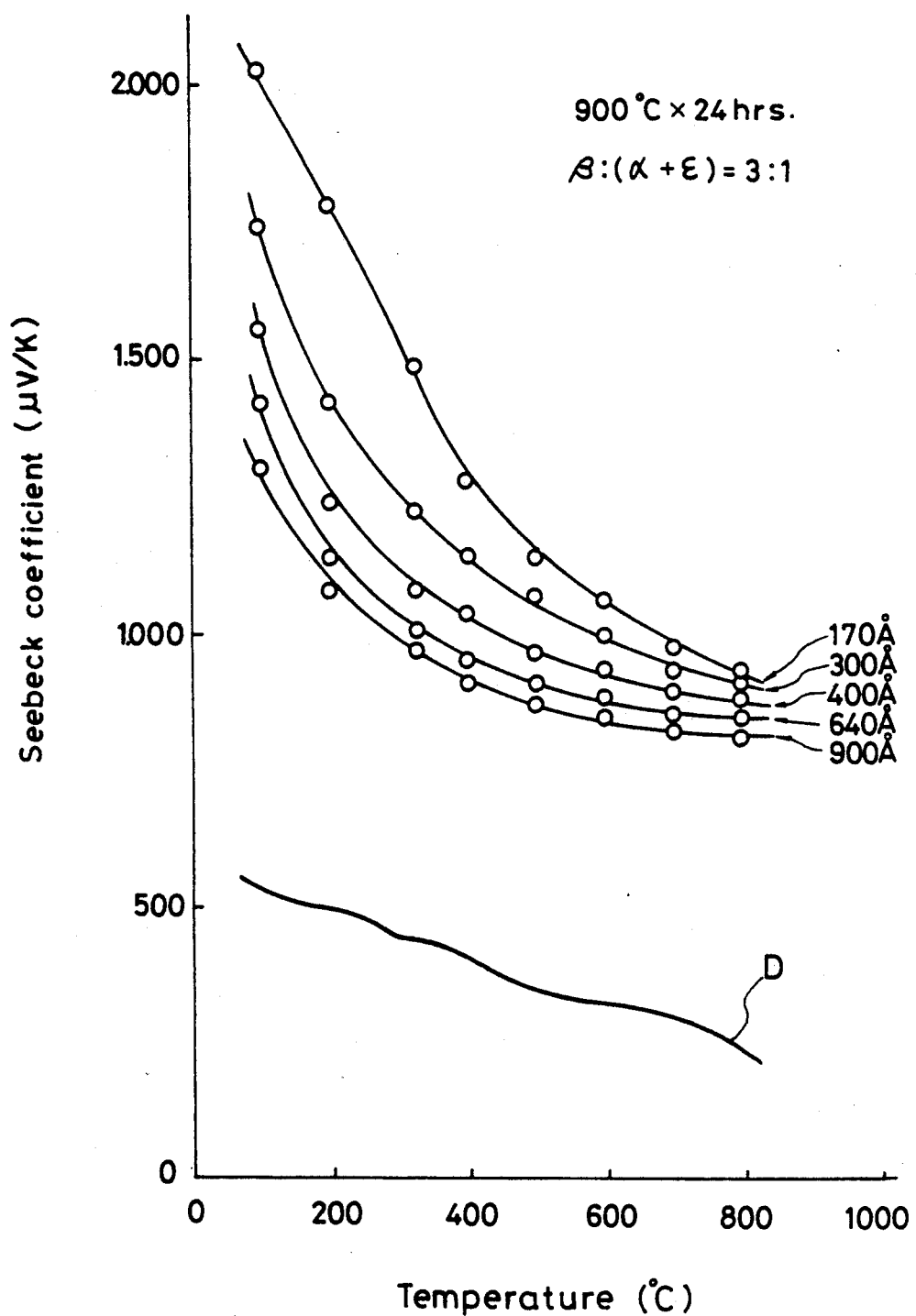
FIG. 4 is a graph showing the relation between temperature and Seebeck coefficient in the thermoelectric element sintered at 900° C. in Example 1.
Figure 5:
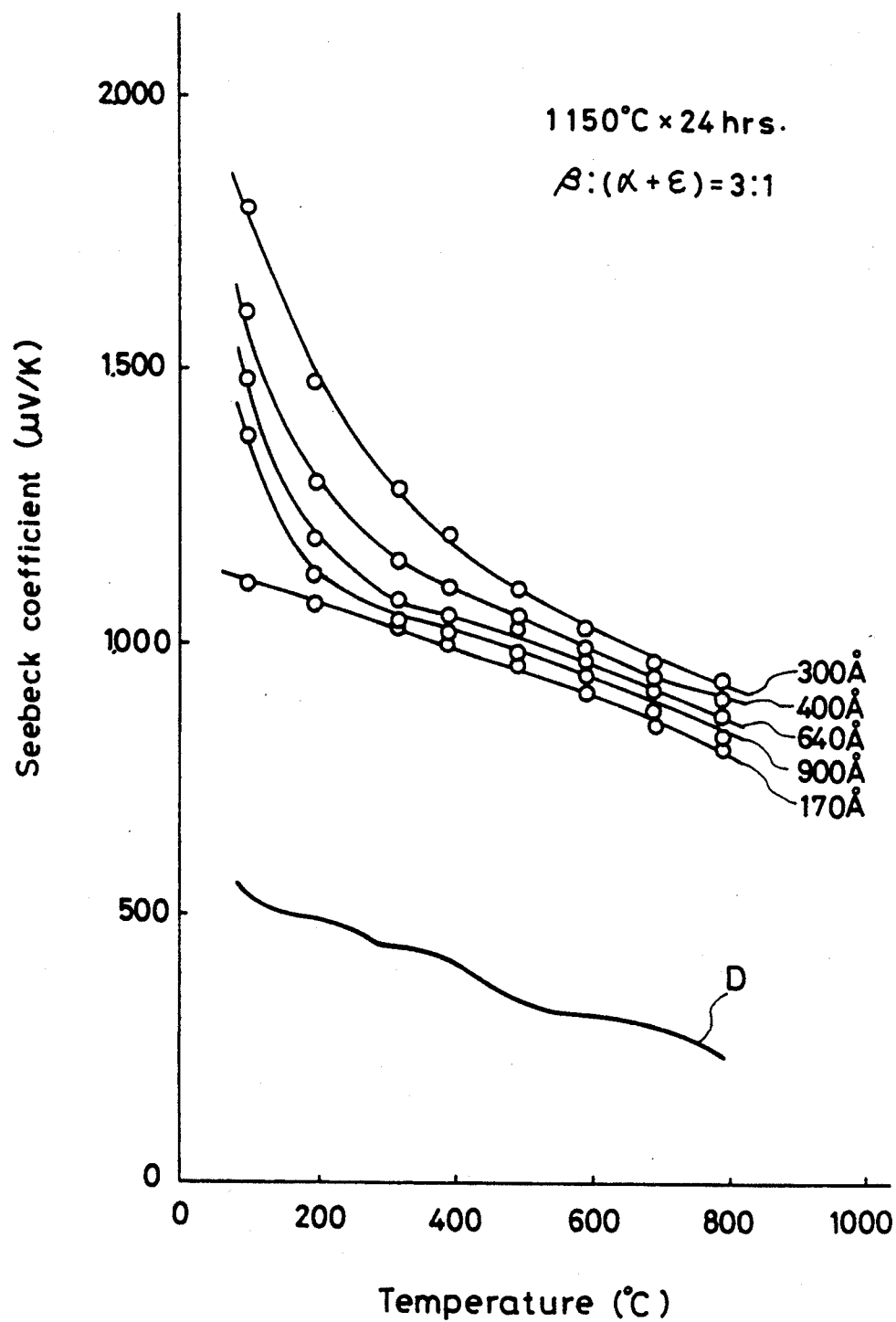
FIG. 5 is a graph showing the relation between temperature and Seebeck coefficient in the thermoelectric element sintered at 1,150° C. in Example 1.

A relation between temperature and Seebeck coefficient in the thermoelectric element made of each particle diameter sintered at 850° C. was measured, and the results are shown in FIG. 3. Similarly, a relation between temperature and Seebeck coefficient in the thermoelectric element sintered at 900° C. is shown in FIG. 4, and a relation between temperature and Seebeck coefficient in the thermoelectric element sintered at 1,150° C. is shown in FIG. 5.

COMPARATIVE EXAMPLE 1

Using the same material as used in Example 1, a thermoelectric element was produced by the conventional powder metallurgical method. Raw material was metal phase. This conventional thermoelectric element was measured for Seebeck coefficient, and the results are shown in FIGS. 3 to 5 as Curve D.

EXAMPLE 2

Figure 6:
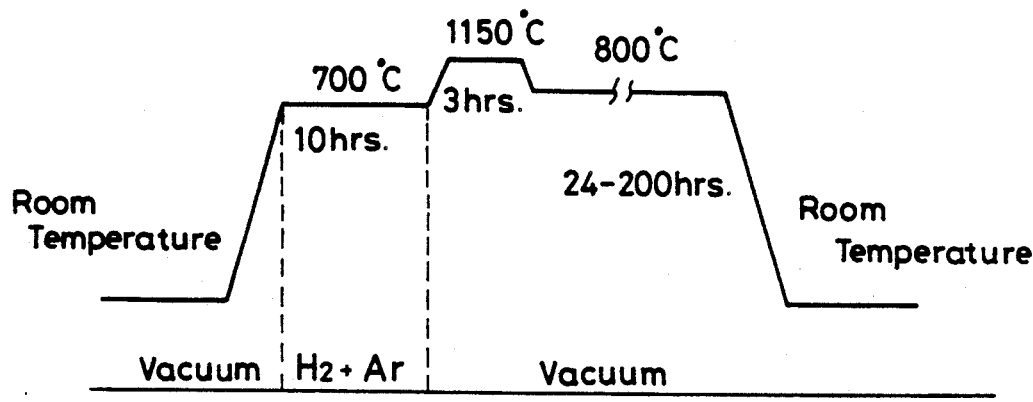
FIG. 6 is a graph showing temperature patterns in heat treatment of Examples 2, 4, 7 and 8, and Comparative Examples 2 and 4.

As the raw material, ultra fine particles having the composition and particle diameter shown in Table 1 were prepared by the plasma method using a high frequency. Argon (Ar) was used as a carrier gas, and a mixed gas of H₂ and Ar (H₂/Ar=10/90 (%)) was introduced at a rate of 2,000 ml/min per kilogram of the raw material. In the reducing atmosphere comprising the mixed gas, the first heat treatment was carried out at 700° C. for 10 hours and then the second heat treatment was carried out under a reduced pressure of $10^{-5}$ torr at 1,150° C. for 3 hours, and subsequently, the third heat treatment was carried out at 800° C. for 80 hours. A temperature pattern of these heat treatments is shown in FIG. 6.

Subsequently, ultra fine particles after the heat treatments were molded under a pressure of 2 ton/cm² by the use of a compression molding machine, sintered at 1,150° C. for 10 hours, and further were subjected to heat treatment at 800° C. for 80 hours to produce a thermoelectric element. This thermoelectric element was measured for thermoelectric characteristics at 800° C. The results are shown in Table 1.

EXAMPLE 3

Figure 7:
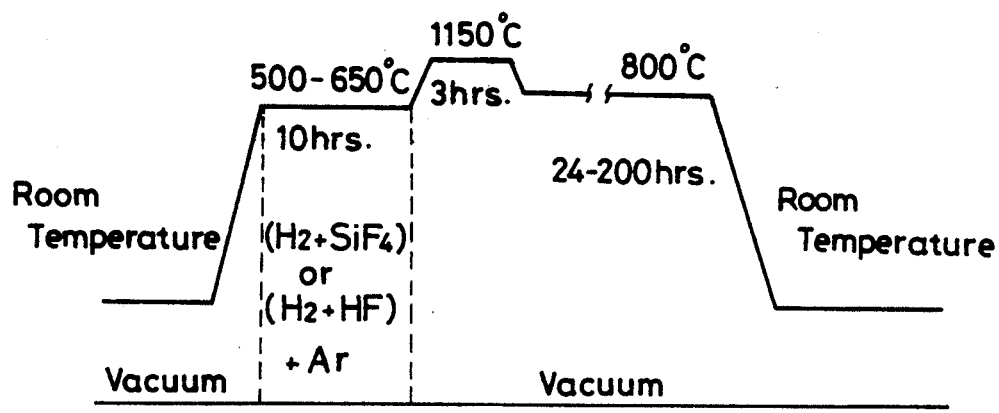
FIG. 7 is a graph showing temperature patterns in heat treatment of Examples 3, 5 and 9, and Comparative Examples 3 and 5.

A thermoelectric element was produced in the same manner as in Example 2 except that the heat treatment was carried out according to the temperature pattern shown in FIG. 7 while introducing mixed gas of $H_2$ and $SiF_4$ in the formulation of $(H_2+SiF_4)/Ar=(5+5)/90$ at a rate of 2,000 ml/min per kilogram of the raw material. This thermoelectric element was measured for thermoelectric characteristics. The results are shown in Table 1.

EXAMPLE 4

As the ultra fine particles, ultra fine particles having the formulation and mean particle diameter shown in Table 1 were used, and heat treatment was applied at a temperature pattern shown in FIG. 6 while introducing mixed gas of $H_2$ and Ar in the formulation that $H_2/Ar=10/90$ (%) at a rate of 3,000 ml/min per kilogram of the raw material. Thereafter, molding, sintering and heat treatment were carried out in the same manner as in Example 2 to produce a thermoelectric element. This thermoelectric element was measured for thermoelectric characteristics. The results are shown in Table 1.

COMPARATIVE EXAMPLE 2

A thermoelectric element was produced in the same manner as in Example 4 except that the powder as the raw material was produced by the powder metallurgical method. Raw material was metal phase. This thermoelectric element was measured for thermoelectric characteristics. The results are shown in Table 1.

EXAMPLE 5

A thermoelectric element was produced in the same manner as in Example 4 except that heat treatment was carried out at the temperature pattern shown in FIG. 7 while introducing mixed gas of $H_2$ and $SiF_4$ in the formulation of $(H_2+SiF_4)/Ar=(5+5)/90$ (%) at a rate of 3,000 ml/min per kilogram of the raw material. Raw material was metal phase. This thermoelectric element was measured for thermoelectric characteristics in the same manner as in Example 4. The results are shown in Table 1.

COMPARATIVE EXAMPLE 3

A thermoelectric element was produced in the same manner as in Example 5 except that the powder as the raw material was produced by the powder metallurgical method. Raw material was metal phase. This thermoelectric element was measured for thermoelectric characteristics in the same manner as in Example 5. The results are shown in Table 1.

EXAMPLE 6

As the raw material, metal alloy ultra fine particles having the formulation and mean particle diameter shown in Table 1 were prepared by the high frequency plasma method. They were molded under a pressure of 2 ton/cm$^2$ and presintered at 700° C. for 10 hours in a reducing atmosphere of $H_2/Ar=10/90$ (%) with argon (Ar) as a carrier gas which had been introduced at a rate of 2,000 ml/min per kilogram of the raw material and then heat treatment was carried out under a reduced pressure of $10^{-5}$ torr at 1,150° C. for 3 hours and then at 800° C. for 80 hours.

The thermoelectric element thus obtained was measured for thermoelectric characteristics at 800° C. The results are shown in Table 1.

EXAMPLE 7

A thermoelectric element was produced in the same manner as in Example 4 except that the heat treatment of the ultra fine particles in the reducing gas atmosphere was not carried out. This thermoelectric element was measured for thermoelectric characteristics in the same manner as in Example 4. The results are shown in Table 1.

EXAMPLE 8

As the raw material, ultra fine particles having the formulation and mean particle diameter shown in Table 2 were used. They were subjected to heat treatment at the temperature pattern shown in FIG. 6 while introducing $H_2$ in the formulation of $H_2/Ar=10/90$ (%) at a rate of 1,800 ml/min per kilogram of the raw material. Thereafter, molding, sintering and heat treatment were carried out in the same manner as in Example 2 to produce a thermoelectric element. This thermoelectric element was measured for thermoelectric characteristics. The results are shown in Table 2.

COMPARATIVE EXAMPLE 4

A thermoelectric element was produced in the same manner as in Example 8 except that the powder as the raw material was produced by the powder metallurgical method. Raw material was metal phase. This thermoelectric element was measured for thermoelectric characteristics in the same manner as in Example 8. The results are shown in Table 2.

EXAMPLE 9

A thermoelectric element was produced in the same manner as in Example 8 except that the heat treatment was carried out at the temperature pattern shown in FIG. 7 while introducing mixed gas of $H_2$ and HF in the formulation of $(H_2+HF)/Ar=(5+5)/90$ at a rate of 1,000 ml/min per kilogram of the raw material in the reduction treatment (heat treatment) of the ultra fine particles as the raw material. This thermoelectric element was measured for thermoelectric characteristics in the same manner as in Example 8. The results are shown in Table 2.

COMPARATIVE EXAMPLE 5

A thermoelectric element was produced in the same manner as in Example 9 except that the powder as the raw material was produced by the powder metallurgical method. Raw material was metal phase. This thermoelectric element was measured for thermoelectric characteristics in the same manner as in Example 9. The results are shown in Table 2.

EXAMPLE 10

$Fe_{0.92}Mn_{0.08}Si_{2.00}$ as the raw material was ground to ultra fine particles having a mean particle diameter of about 500 Å by the high frequency plasma method, and at the same time, a predetermined amount of Fe and Si, and Mn element as a dopant were dissolved by application of high frequency, and then gradually cooled. The ingot thus obtained was sliced and ground with a stamp mill to produce particles (powder) which had a mean particle diameter of 2 to 3 μm and were not uniform in shape. Then, 20 wt % of the ultra fine particles and 80 wt % of the powder were mixed.

In this mixing, preliminary mixing was carried out for 3 hour at 700 rpm by the use of a high speed ball mill, and to the resulting mixed powder, a 1 wt % aqueous solution of PVA (polyvinyl alcohol; molecular weight: less than 1,500) was added to form a gel or sol.

The sol or gel was heated while applying ultrasonic waves and granulated to produce granules having a water content of 10 to 20 wt % and a mean particle diameter of 0.5 mm.

The mixed powder in the granular form was molded under a pressure of 2 ton/cm$^2$ by the use of a compression molding machine, sintered by heating in a vacuum at 1,150° C. for 3 hours, and subjected to heat treatment at 800° C. for 30 hours to produce a thermoelectric element. This thermoelectric element was measured for thermoelectric characteristics. The results are shown in Table 3.

COMPARATIVE EXAMPLE 6

A thermoelectric element was produced in the same manner as in Example 10 except that as only powders having a mean particle diameter of 2 to 3 μm produced in the same manner as in Example 10 were used for the raw material. This thermoelectric element was measured for thermoelectric characteristics. The results are shown in Table 3.

EXAMPLE 11

Using $Fe_{0.97}Mn_{0.03}Si_{2.00}$ as the raw material, both ultra fine particles and powder were produced in the same manner as in Example 10. They were then mixed, molded, sintered and heated in the same manner as in Example 10 to produce a thermoelectric element. This thermoelectric element was measured for thermoelectric characteristics in the same manner as in Example 10. The results are shown in Table 3.

COMPARATIVE EXAMPLE 7

A thermoelectric element was produced in the same manner as in Example 11 except that only the powder was used as the raw material. This thermoelectric element was measured for thermoelectric characteristics in the same manner as in Example 11. The results are shown in Table 3.

EXAMPLE 12

A thermoelectric element was produced in the same manner as in Example 10 except that a mixture of 5 wt % of the ultra fine particles and 95 wt % of the powder was used. This thermoelectric element was measured for thermoelectric characteristics. The results are shown in Table 3.

EXAMPLE 13

A thermoelectric element was produced in the same manner as in Example 10 except that a mixture of 91 wt % of the ultra fine particles and 9 wt % of the powder was used. This thermoelectric element was measured for thermoelectric characteristics in the same manner as in Example 10. The results are shown in Table 3.

TABLE 1

| No. | Fine Particle Composition $(Fe_{1-x}Mn_xSi_{2-y}O_yF_z)$ | | | Mean Particle Diameter | Gas for Heat Treatment | Composition of Fine Particles after Heat Treatment $(Fe_{1-x}Mn_xSi_{2-y}O_yF_z)$ | | | Thermoelectric Characteristics | | |
|---|---|---|---|---|---|---|---|---|---|---|---|
| | x | y | z | | | x | y | z | Electromotive Force E (V) | Resistance R (Ω) | Output P* (W) |
| Example 2 | 0 | 0.18 | 0 | 700 Å | $H_2$ | 0 | 0.072 | 0 | 0.22 | 0.42 | 0.12 |
| Example 3 | 0 | 0.18 | 0 | 700 Å | $H_2 + SiF_4$ | 0 | 0.081 | 0.03 | 0.21 | 0.46 | 0.096 |
| Example 4 | 0.08 | 0.11 | 0 | 700 Å | $H_2$ | 0.08 | 0.052 | 0 | 0.27 | 0.41 | 0.18 |
| Comparative Example 2 | 0.08 | 0 | 0 | 3 μm | $H_2$ | 0.08 | 0 | 0 | 0.24 | 0.55 | 0.10 |
| Example 5 | 0.08 | 0.11 | 0 | 700 Å | $H_2 + SiF_4$ | 0.08 | 0.033 | 0.04 | 0.29 | 0.38 | 0.22 |
| Comparative Example 3 | 0.08 | 0 | 0 | 3 μm | $H_2 + SiF_4$ | 0.08 | 0 | 0 | 0.24 | 0.52 | 0.11 |
| Example 6 | 0 | 0.18 | 0 | 700 Å | $H_2$ | 0 | 0.072 | 0 | 0.24 | 0.41 | 0.14 |
| Example 7 | 0.08 | 0.11 | 0 | 700 Å | — | 0.08 | 0.10 | 0 | 0.23 | 0.56 | 0.094 |

*Calculated from the equation: P (watt) = $V^2/R$.

TABLE 2

| No. | Fine Particle Composition $(Fe_{1-x}Co_xSi_{2-y}O_yF_z)$ | | | Mean Particle Diameter | Gas for Heat Treatment | Composition of Fine Particles after Heat Treatment $(Fe_{1-x}Co_xSi_{2-y}O_yF_z)$ | | | Thermoelectric Characteristics | |
|---|---|---|---|---|---|---|---|---|---|---|
| | x | y | z | | | x | y | z | Electromotive Force E (V) | Resistance R (Ω) |
| Example 8 | 0.05 | 0.13 | 0 | 500 Å | $H_2$ | 0.05 | 0.044 | 0 | 0.28 | 0.22 |
| Comparative Example 4 | 0.05 | 0 | 0 | 3 μm | $H_2$ | 0.05 | 0 | 0 | 0.24 | 0.32 |
| Example 9 | 0.05 | 0.13 | 0 | 500 Å | $H_2 + HF$ | 0.05 | 0.025 | 0.04 | 0.29 | 0.31 |
| Comparative Example 5 | 0.05 | 0 | 0 | 3 μm | $H_2 + HF$ | 0.05 | 0 | 0 | 0.24 | 0.32 |

TABLE 3*

| No. | $\alpha^2 \cdot \sigma \cdot 10^3$ (W/K$^2$m)*1 | K (W/K · m)*2 | Z · $10^3$ (K$^{-1}$)*3 |
|---|---|---|---|
| Example 10 | 1.1 | 2.7 | 0.41 |
| Comparative Example 6 | 1.0 | 3.5 | 0.29 |
| Example 11 | 0.8 | 2.5 | 0.32 |
| Comparative Example 7 | 0.8 | 3.5 | 0.23 |
| Example 12 | 1.04 | 3.44 | 0.30 |

TABLE 3*-continued

| No. | $\alpha^2 \cdot \sigma \cdot 10^3$ (W/K$^2$m)*1 | K (W/K · m)*2 | Z · 10$^3$ (K$^{-1}$)*3 |
|---|---|---|---|
| Example 13 | 1.06 | 3.4 | 0.31 |

*Measured at a temperature of 670 K.
*1 α: Seebeck coefficient (V/K) σ: Specific resistance ($\Omega^{-1}$m$^{-1}$)
*2 K: Thermal conductivity (W/K · m)
*3 Figure of merit (K$^{-1}$) Z = $\alpha^2 \cdot \sigma$/K As Z is larger, thermoelectric characteristics (efficiency of conversion of heat energy into electric energy) are greater.

What is claimed is:

1. In a method for producing thermoelectric elements by molding powders of metal or metal alloy as the raw material and then sintering, the improvement which comprises using ultra fine powders containing Fe and Si as main components and having a mean particle diameter of 50 to 5,000 Å as the raw material, wherein the ultra fine powders are subjected to heat treatment in a reducing gas atmosphere said ultra fine powders being obtained by subjecting said metal or metal alloy to plasma treatment.

2. The method as claimed in claim 1 wherein the ultra fine powders are mixed phase of semiconductor phase and metal phase.

3. In a method for producing thermoelectric elements by molding powders of metal or metal alloy as the raw material and then sintering, the improvement which comprises using mixed powders of ultra fine powders containing Fe and Si as main components and having a mean particle diameter of 50 to 5,000 Å and powders having a mean particle diameter of 1 to 5 μm, as the raw material wherein the ultra fine powders are obtained by subjecting said metal or metal alloy to plasma treatment.

4. The method as claimed in claim 3 wherein the ultra fine powders are mixed phase of semiconductor phase and metal phase.

5. The method as claimed in claim 3 wherein the ultra fine powders are subjected to heat treatment in a reducing gas atmosphere.

6. The method as claimed in claim 5, wherein said reducing gas atmosphere contains a halogen or a halogen compound.

7. The method as claimed in claim 3, wherein said mixed powders consist essentially of 97 to 50 wt % of powders having a mean particle diameter of 1 to 5 μm and 3 to 50 wt % of said ultra fine powders.

8. The method as claimed in claim 3, wherein said mixed powders consists essentially of 95 to 60 wt % of powders having a mean particle diameter of 1 to 5 μm and 5 to 40 wt % of said ultra fine powders.

9. A method for producing thermoelectric elements comprising:
introducing a powder of metal or metal alloy containing Fe and Si as main components into a plasma furnace;
gasifying said powder by generating a high temperature plasma;
solidifying the gasified powder by quenching to produce ultra fine particles containing Fe and Si as main components and having a mean particle diameter of 50 to 5,000 Å;
heat treating said ultra fine particles in a reducing gas atmosphere;
molding said ultra fine particles; and
sintering the molded ultra fine particles.

* * * * *